United States Patent
Sinangil et al.

(10) Patent No.: US 12,131,800 B2
(45) Date of Patent: Oct. 29, 2024

(54) PHYSICALLY UNCLONABLE CELL USING DUAL-INTERLOCKING AND ERROR CORRECTION TECHNIQUES

(71) Applicant: NVIDIA Corp., Santa Clara, CA (US)

(72) Inventors: Mahmut Ersin Sinangil, Los Altos, CA (US); Sudhir Shrikantha Kudva, Dublin, CA (US); Nikola Nedovic, San Jose, CA (US); Carl Thomas Gray, Apex, NC (US)

(73) Assignee: NVIDIA Corp., Santa Clara, CA (US)

( * ) Notice: Subject to any disclaimer, the term of this patent is extended or adjusted under 35 U.S.C. 154(b) by 111 days.

(21) Appl. No.: 18/056,158

(22) Filed: Nov. 16, 2022

(65) Prior Publication Data
US 2024/0161800 A1   May 16, 2024

(51) Int. Cl.
*G11C 7/24* (2006.01)
*G11C 7/10* (2006.01)
*G11C 7/20* (2006.01)

(52) U.S. Cl.
CPC .............. *G11C 7/24* (2013.01); *G11C 7/1063* (2013.01); *G11C 7/20* (2013.01)

(58) Field of Classification Search
CPC ............ G11C 7/24; G11C 7/1063; G11C 7/20
See application file for complete search history.

(56) References Cited

U.S. PATENT DOCUMENTS

| | | | |
|---|---|---|---|
| 6,118,869 A | 9/2000 | Kelem et al. | |
| 6,873,551 B2 | 3/2005 | Bedarida et al. | |
| 7,492,630 B2 | 2/2009 | Scheuerlein et al. | |
| 7,495,947 B2 | 2/2009 | Scheuerlein et al. | |
| 7,522,448 B2 | 4/2009 | Scheuerlein et al. | |
| 7,719,874 B2 | 5/2010 | Scheuerlein et al. | |
| 8,981,810 B1 | 3/2015 | Trimberger et al. | |
| 9,213,835 B2 | 12/2015 | Lesea et al. | |
| 9,276,583 B1 | 3/2016 | Satpathy et al. | |
| 9,279,856 B2 | 3/2016 | Laackmann et al. | |
| 9,355,743 B2 | 5/2016 | Ghosh et al. | |
| 9,369,277 B2 | 6/2016 | Augustine et al. | |
| 9,698,611 B2 | 7/2017 | Li et al. | |
| 9,768,757 B1* | 9/2017 | Gaspard | H03K 3/35625 |
| 9,947,391 B1 | 4/2018 | Mahatme et al. | |
| 10,224,931 B1 | 3/2019 | Wang et al. | |

(Continued)

FOREIGN PATENT DOCUMENTS

| | | |
|---|---|---|
| CN | 110020557 A | 7/2019 |
| CN | 108734030 B | 7/2020 |

(Continued)

OTHER PUBLICATIONS

U.S. Appl. No. 17/481,154, Sep. 21, 2021, Sudhir Shrikantha Kudva.

(Continued)

*Primary Examiner* — Alfredo Bermudez Lozada
(74) *Attorney, Agent, or Firm* — Rowan TELS LLC (57) ABSTRACT

PUF cells utilizing a dual-interlocking scheme demonstrating improved noise immunity and stability across different V/T conditions and different uses over time in noisy environments. The PUF cell may be advantageously utilized in conjunction with error detection techniques that screen out unstable cells. A set of such PUF cells utilized to generate a device-specific bit pattern, for example a master key.

24 Claims, 6 Drawing Sheets

(56) References Cited

U.S. PATENT DOCUMENTS

| | | |
|---|---|---|
| 10,439,613 B2 | 10/2019 | Karpinskyy et al. |
| 10,439,829 B1 | 10/2019 | Lin et al. |
| 10,553,886 B2 | 2/2020 | Buelte et al. |
| 10,574,469 B1 | 2/2020 | Garni et al. |
| 10,644,712 B2 | 5/2020 | Cai et al. |
| 10,714,199 B1 | 7/2020 | Bill |
| 10,764,069 B1 | 9/2020 | Hurwitz |
| 11,171,793 B2 | 11/2021 | Schat |
| 11,411,563 B1 | 8/2022 | Kudva et al. |
| 2002/0170146 A1 | 11/2002 | Thompson |
| 2015/0192637 A1 | 7/2015 | Falk et al. |
| 2016/0285639 A1 | 9/2016 | Mathew et al. |
| 2016/0329897 A1 | 11/2016 | Gu |
| 2017/0047917 A1 | 2/2017 | Heo et al. |
| 2017/0272258 A1 | 9/2017 | Tanamoto et al. |
| 2018/0218177 A1 | 8/2018 | Kuenemund et al. |
| 2019/0068190 A1 | 2/2019 | Karpinskyy et al. |
| 2019/0116052 A1* | 4/2019 | Kim .................. H04L 9/3278 |
| 2019/0165956 A1 | 5/2019 | Adham et al. |
| 2020/0044872 A1 | 2/2020 | Willsch et al. |
| 2021/0135886 A1 | 5/2021 | Lee |
| 2021/0328818 A1 | 10/2021 | Sonntag |
| 2021/0336804 A1 | 10/2021 | Parhi et al. |
| 2022/0052691 A1 | 2/2022 | Borrel et al. |
| 2022/0271752 A1 | 8/2022 | Kudva et al. |
| 2022/0271951 A1 | 8/2022 | Kudva et al. |
| 2022/0271952 A1 | 8/2022 | Kudva et al. |

FOREIGN PATENT DOCUMENTS

| | | |
|---|---|---|
| CN | 111723408 A | 9/2020 |
| CN | 2022101293606 | 2/2022 |
| CN | 2022101293644 | 2/2022 |
| DE | 1020221035123 | 2/2022 |
| DE | 1020221042820 | 2/2022 |
| EP | 3640945 B1 | 3/2021 |
| TW | 110111882 | 3/2021 |

OTHER PUBLICATIONS

U.S. Appl. No. 17/546,438, Dec. 9, 2021, Sudhir Shrikantha Kudva.

108-0436-TW_Jul. 14, 2022_Second Office Action.

20-SC-0535TW01 Official Communication Taiwan Intellectual Property Office First Office Action dated Apr. 7, 2022.

Calin et al, Upset Hardened Memory Design for Submicron CMOS Technology, IEEE Transactions on Nuclear Science, Dec. 1996, pp. 2874-2878, vol. 43, No. 6, Grenoble, France.

He et al, An Automatic Self-Checking and Healing Physically Unclonable Function (PUF), ISSCC 2021, Rice University, Houston, TX.

NPL_Alam et al_ Challenges and Opportunities in Analog and Mixed Signal(AMS) Integrated Circuit (IC) Security_11272017_ pp. 16-32_Department of Electrical and Computer Engineering, University of Florida, Gainesville, FL 32603, USA.

NPL_Matthew et al _ "PVT-Variation-Tolerant Hybrid Physically Unclonable Function Circuit for 100% Stable Secure Key Generation in 22nm CMOS"_ Feb. 11, 2014 _ pp. 278-280.

Shifman et al, A Method to Improve Reliability in a 65-nm SRAM PUF Array, IEEE Solid-State Circuits Letters, Jun. 2018, pp. 138-141, vol. 1, No. 6.

Su et al, A Digital 1.6 pJ/bit Chip Identification Circuit Using Process Variations, IEEE Journal of Solid-State Circuits, Jan. 2008, pp. 69-77, vol. 43, No. 1.

Yang et al, A Physically Unclonable Function with BER <$10^{\wedge}8$ for Robust Chip Authentication Using Oscillator Collapse in 40nm CMOS, ISSCC 2015, University of Michigan, Ann Arbor, MI.

\* cited by examiner

PHYSICALLY UNCLONABLE CELL USING DUAL-INTERLOCKING AND ERROR CORRECTION TECHNIQUES

BACKGROUND

Physically Unclonable Function (PUF) cells are utilized in digital devices to generate a master key (bit pattern) that is applied to generate other keys utilized for (for example) encryption and decryption. The PUF cells in different devices comprise a similar circuit structure but utilize the process variation of individual circuit die to generate unique keys in each device.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Instantaneous noise levels and other environmental variations in a device may cause the output of PUF cells to flip (change value) between uses. For consistent operation, the randomness of the PUF cell outputs is a metric to minimize. Another important consideration is the effect of voltage/temperature (V/T) on the PUF output, because the V/T interaction with the process variation is what enables the PUF functionality. Ideally, the PUF cell output is stable (does not flip) across different V/T conditions and different uses over time in noisy environments.

PUF cell embodiments utilizing a dual-interlocking scheme may demonstrate a higher noise immunity than conventional PUF cells. These dual-interlocking structures may be utilized in conjunction with error detection techniques that screen out (identify and disable) unstable cells. A set of such PUF cells may be utilized to generate a device-specific bit pattern. This bit pattern may for example be utilized as a master key for encryption.

The embodiments shown herein utilize a dual-interlocking configuration of four inverters coupled to a header device and four reset devices. One of ordinary skill in the art will readily comprehend that additional interlocking inverter pairs in addition to the two pairs illustrated herein may be implemented in analogous configurations to those shown, where such implementations offer additional stability, improved V/T response, etc.

Figure 1:
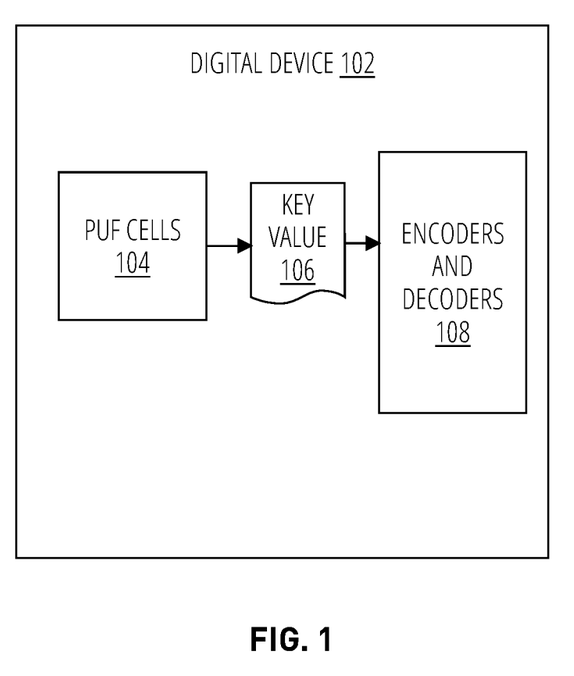
FIG. 1 depicts an example of a digital device 102 that utilizes PUF cells to generate a key value.

FIG. 1 depicts an example of a digital device 102 utilizing PUF cells 104 to generate a bit pattern such as a key value 106 for use by encoders and decoders 108, e.g., for encryption. Some or all of the PUF cells may utilize a dual-interlocked arrangement of inverters as described in more detail below.

Figure 2A:
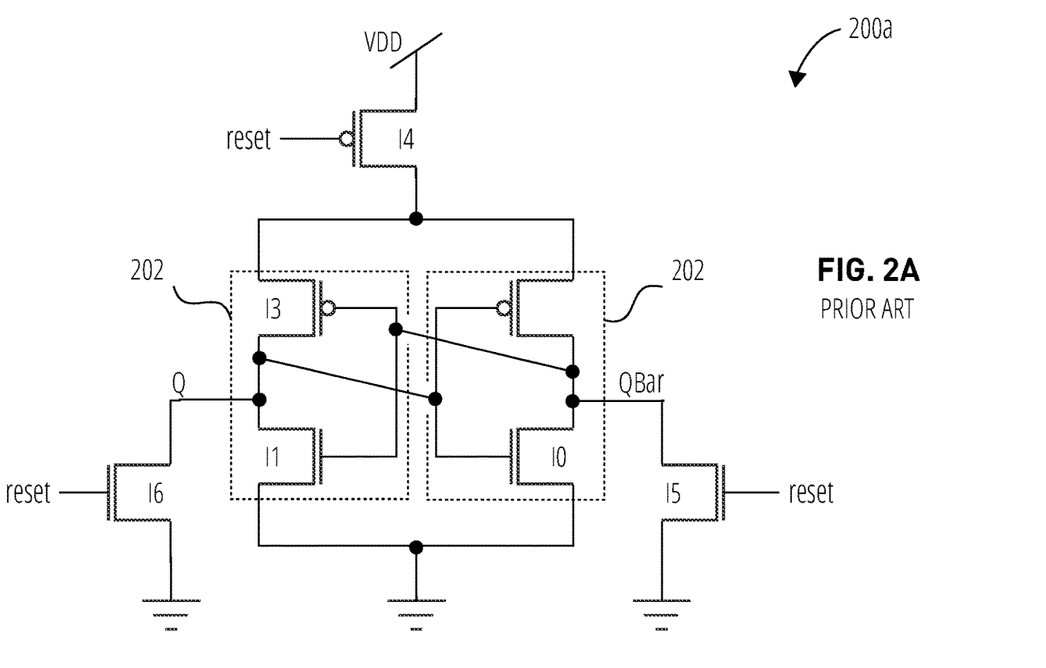
FIG. 2A depicts a conventional PUF cell 200a based on a static random access memory cell.

FIG. 2A depicts a conventional PUF cell 200a based on a static random access memory (SRAM) cell. The conventional PUF cell 200a comprises transistors I0, I1, I2, I3, I4, I5, and I6, arranged as a pair of cross-coupled inverters 202 implementing storage nodes Q and Qbar (where "bar" indicates complement). The cell further comprises two reset devices I5 and I6 operated by reset signals, and a header device I4 to connect or disconnect a voltage source VDD from the inverters 202 in response to the reset signal. The various components may comprise metal oxide semiconductor (MOS) transistors.

The reset devices I5 and I6 are operated to initialize the stored state of the storage nodes Q and Qbar in the conventional PUF cell 200a.

During reset (reset signal='1'), the state of the storage nodes is pulled low and thereby initialized to '0'. Asserting the reset signal also turns the header device I4 off, disconnecting the inverters 202 from the voltage source VDD. When the reset signal goes low (reset signal='0'), the inverters 202 are powered up and the mismatches across these devices determines whether the structure resolves to Q='0'/QBar='1' or Q='1'/QBar='0'.

Figure 2B:
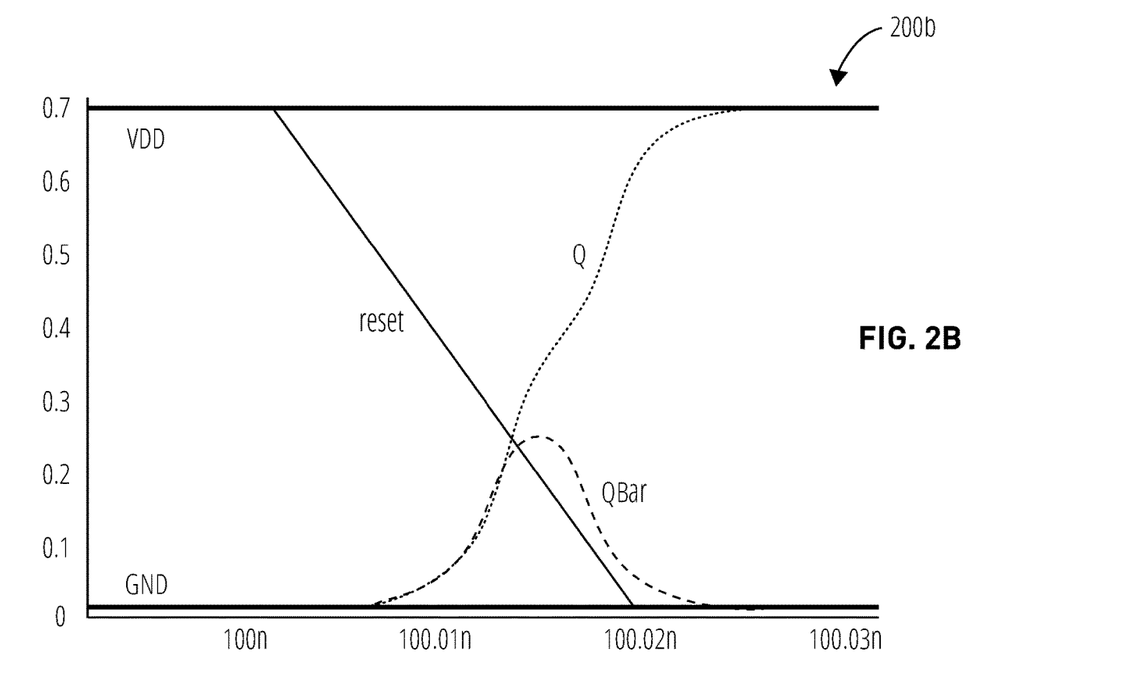
FIG. 2B depicts signal characteristics 200b of the conventional PUF cell 200a of FIG. 2A.

FIG. 2B depicts the signal characteristics 200b of this operation. Noise events, for example in the form of fluctuations in the voltage source VDD and/or effects of thermal noise, may overpower the intrinsic mismatches of the transistors comprising the inverter 202 and cause the conventional PUF cell 200a to settle into different states across samples.

Because these effects are transient, readings of the conventional PUF cell 200a after stabilizing from a reset may vary. Temporal majority voting may be applied to average out transient noise effects but this increases complexity of the overall system.

Figure 3A:
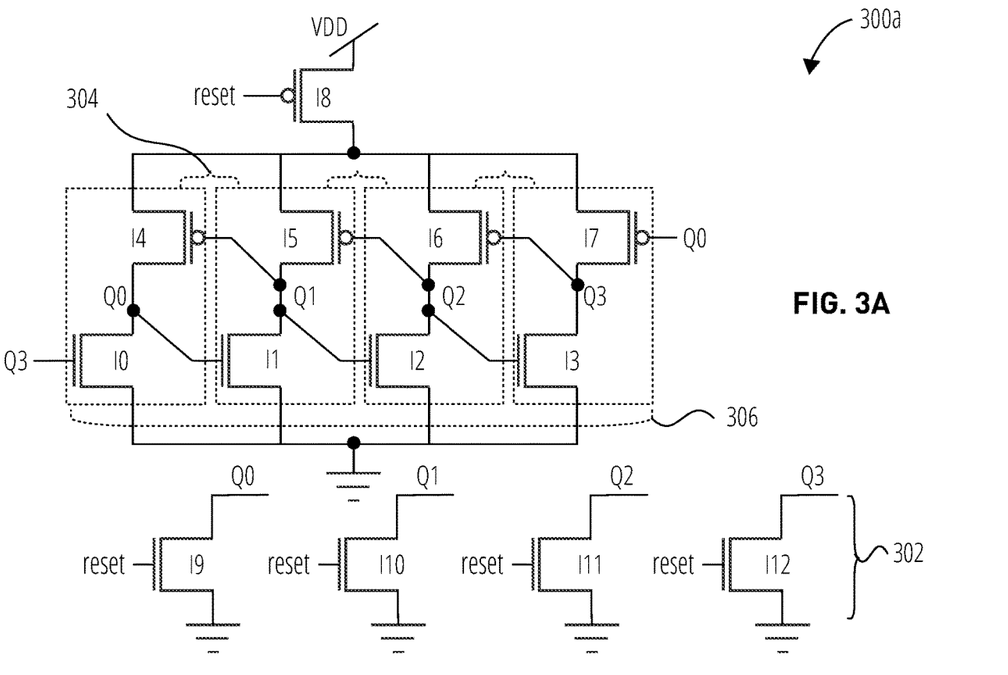
FIG. 3A depicts a dual-interlocked PUF cell 300a in accordance with one embodiment.

FIG. 3A depicts dual-interlocked PUF cell 300a in accordance with one embodiment. The storage cells of the dual-interlocked PUF cell 300a comprise transistors I0, I1, I2, I3, I4, I5, I6, and I7. A header device I8 couples the storage cells to a power supply VDD. Reset devices I9, I10, I11, and I12 are operable to reset a state of the storage nodes Q0-Q3.

The storage cells comprise four inverters 306 arranged into a dual-interlocked arrangement 304. Each of the inverters 306 comprises a PFET and an NFET jointed at a midpoint node. A dual-interlock is a configuration in which the gates of each transistor in each inverter are driven by the mid-point node of a different inverter. The header device I8 controls the coupling of the inverters 306 and the voltage source VDD. The reset devices 202 (I9-I12) initialize the circuit to a known state during assertion of a RESET signal.

Applying a reset signal='1' removes power from the inverters 306 and the NMOS reset devices 302 turn ON, draining charge from the storage nodes Q0-Q3. The dual-interlocked PUF cell 300a is brought out of a reset state by setting the reset signal low (reset signal='0'), turning header device I8 on and reset devices 302 I9-I12 off. Mismatches across the devices of the dual-interlocked arrangement 304 determine the state that each storage node Q0-Q3 settles into. The Q0/Q2 and Q1/Q3 storage node pairs, respectively, will settle and latch to the same logic state (Q0=Q2 and Q1=Q3).

Figure 3B:
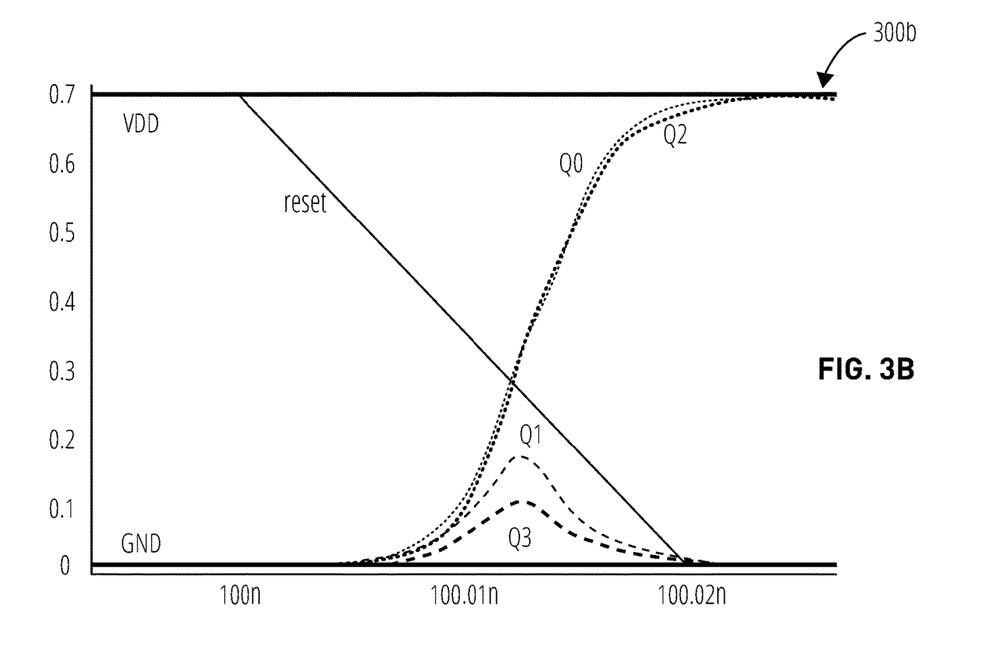
FIG. 3B depicts signal characteristics 300b of the dual-interlocked PUF cell 300a embodiment of FIG. 3A.

FIG. 3B depicts waveforms that demonstrate the signal characteristics 300b of this operation.

The dual-interlocked PUF cell 300a demonstrates greater noise immunity over the conventional PUF cell 200a. This is due to the pairs of storage nodes (Q0/Q2 and Q1/Q3) determining the final state (as opposed to single storage node in the SRAM-based conventional PUF cell 200a). Noise effects on the strengths of individual transistors are less inclined to effectuate a toggling of the output state of the dual-interlocked PUF cell 300a.

An important consideration for PUF design is stability of the cells under different V/T conditions. An mechanism may be implemented to identify PUF cells that are more likely to be unstable across variations in V/T. These potentially unstable cells may be masked (disabled and/or removed from use in generation of bits for a multi-bit pattern).

Figure 4:
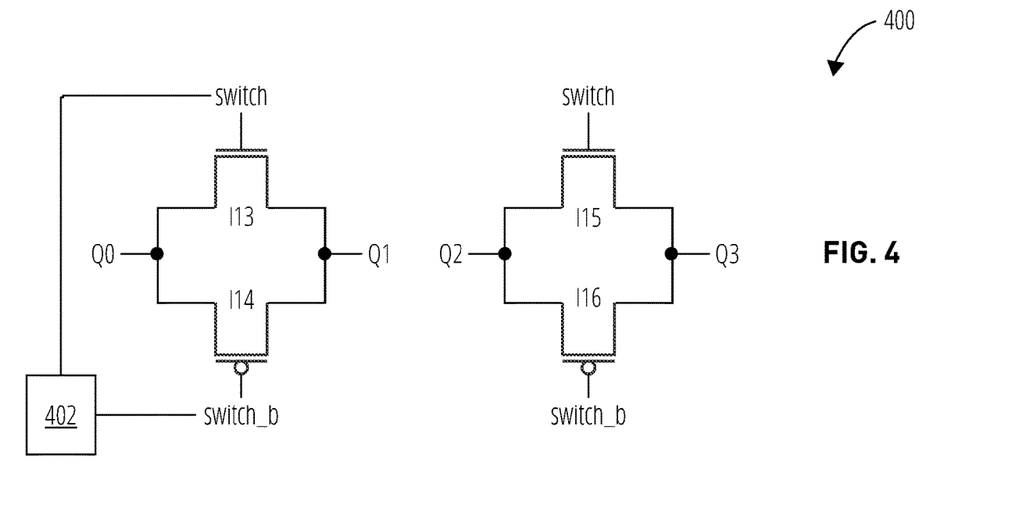
FIG. 4 depicts switches 400 in accordance with one embodiment.

FIG. 4 depicts switches 400 in accordance with one embodiment. The switches 400 comprise transistors I13, I14, I15, and I16, controlled by switching signals generated by logic 402. An error detection scheme may utilize one such switch between each of storage nodes Q0 and Q2 and storage nodes Q1 and Q3. The switches 400 may be configured such that closing the switches 400 bypasses the interlocked connections. In bypassed mode, the interlocked cell becomes operationally equivalent to a conventional SRAM type cell, and thus more susceptible to noise effects.

In general, the logic 402 may be part of the device comprising the PUF cells, or separate from it (e.g., the logic 402 may be implemented in automated test equipment separately from the device with the PUF cells).

In bypassed mode, transistors I2, I3, I6, and I7 are electrically parallel to transistors I0, I1, I4, and I5 respectively. This facilitates an averaging of transistors' strengths.

The unstable cell detection mechanism may be carried out as follows. A sampling of dual-interlocked PUF cell 300a is performed at a selected voltage and temperature with switches 400 OFF followed by another sampling with switches 400 ON. If the output of the dual-interlocked PUF cell 300a is the same for both samplings, the cell is favoring a '0' or '1' state more strongly and is more likely to be stable across temperature and voltage. In contrast, if the output of the dual-interlocked PUF cell 300a is different between the two samplings, the cell is more likely to change its state as voltage and temperature is changed.

In another embodiment, the dual-interlocked PUF cell 300a may be disposed in a re-configurable fashion. The dual-interlocked PUF cell 300a may be sampled multiple times in interlocked mode (switches 400 of FIG. 4 being OFF), then in bypassed mode (switches 400 being ON). Then, for each cell, interlocked or bypass mode is configured as the operational mode for the cell based on which mode showed more consistent outputs. These configuration settings may be stored in a non-volatile memory. If neither of the two modes provided sufficiently stable outputs, the dual-interlocked PUF cell 300a may be marked such that it is not utilized in generation of the bit pattern.

Figure 5:
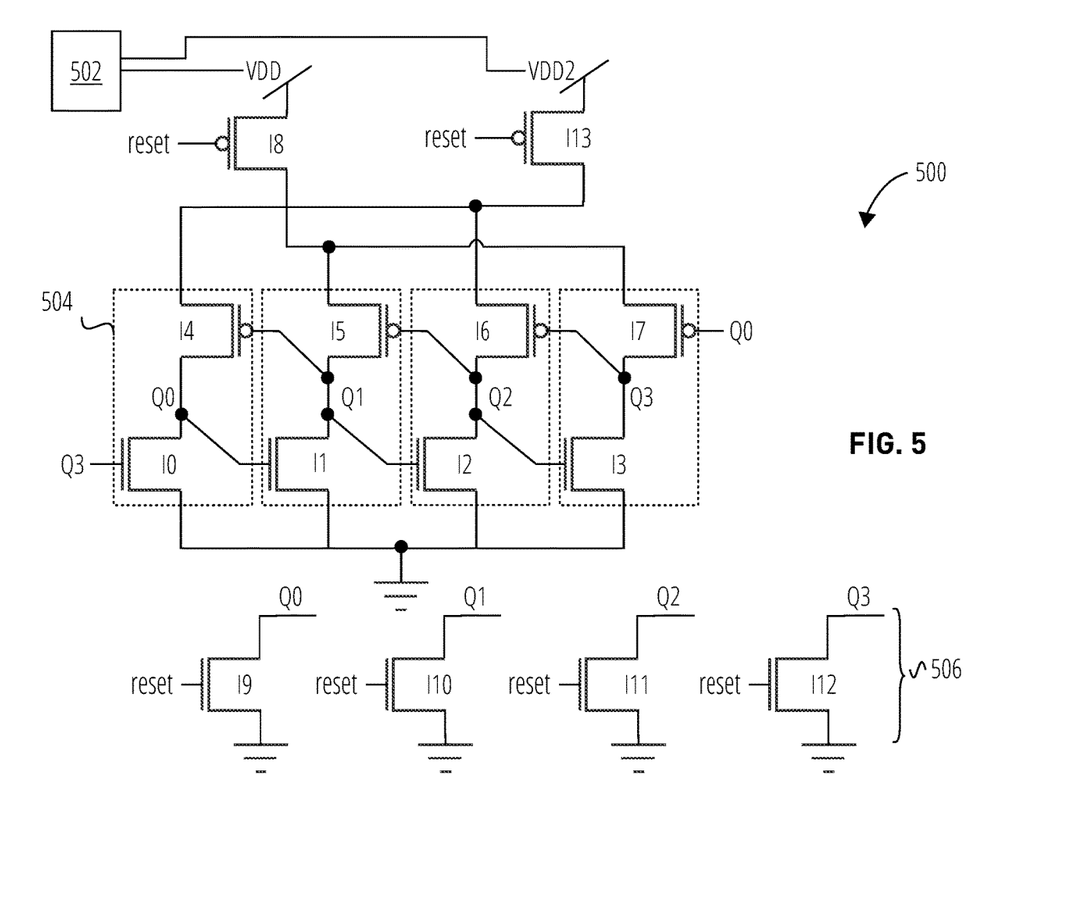
FIG. 5 depicts a dual-interlocked PUF cell 500 in accordance with another embodiment.

FIG. 5 depicts a dual-interlocked PUF cell 500 in accordance with another embodiment. The dual-interlocked PUF cell 500 comprises transistors I0, I1, I2, I3, I4, I5, I6, and I7 arranged to implement four inverters 504. Devices I9, I10, I11, and I12 are configured to operate as reset devices 506, and devices I8 and I13 are arranged as header devices to connect or disconnect the inverters 504 from the power sources VDD and VDD2. The difference between these two voltages may be held constant, or may itself be varied over a number of samples.

By making VDD2 higher (or lower) than VDD through the operation of variable voltage source 502, transistor strengths may be adjusted, and stability of the cell may be tested. For example, by making VDD2 higher (e.g., 5-15% higher) than VDD, I4 and I6 are made stronger, which favors a Q1/Q3='0' state for the storage nodes in the cell. Conversely, making VDD higher than VDD2 by 5%-15% may be used to favor a Q0/Q2='0' output state for the storage nodes.

Other mechanisms may be utilized to adjust the strengths of the transistors to skew a PUF cell to favor a particular state. For example, additional devices may be added in parallel with the inverters 504 with appropriate switches to make them stronger. In another embodiment, logic may be used to adjust a relative arrival time of a plurality of reset signals to initialize the PUF cell.

For example, the arrival of reset signals to header devices I8 and I13 may be adjusted to change the time these devices start to turn on. The delay may be, e.g., on the order of the fan-out-four (FO4) delay of the inverters 504. In one embodiment, the reset signal to I8 may arrive 10 to 20 picoseconds before a delayed reset signal to I13 (or vice versa). This asymmetry of reset may to enhance or weaken stability to reveal an instability in the dual-interlocked PUF cell 500, similar to that revealed by the asymmetry of voltage sources discussed above.

Figure 6:
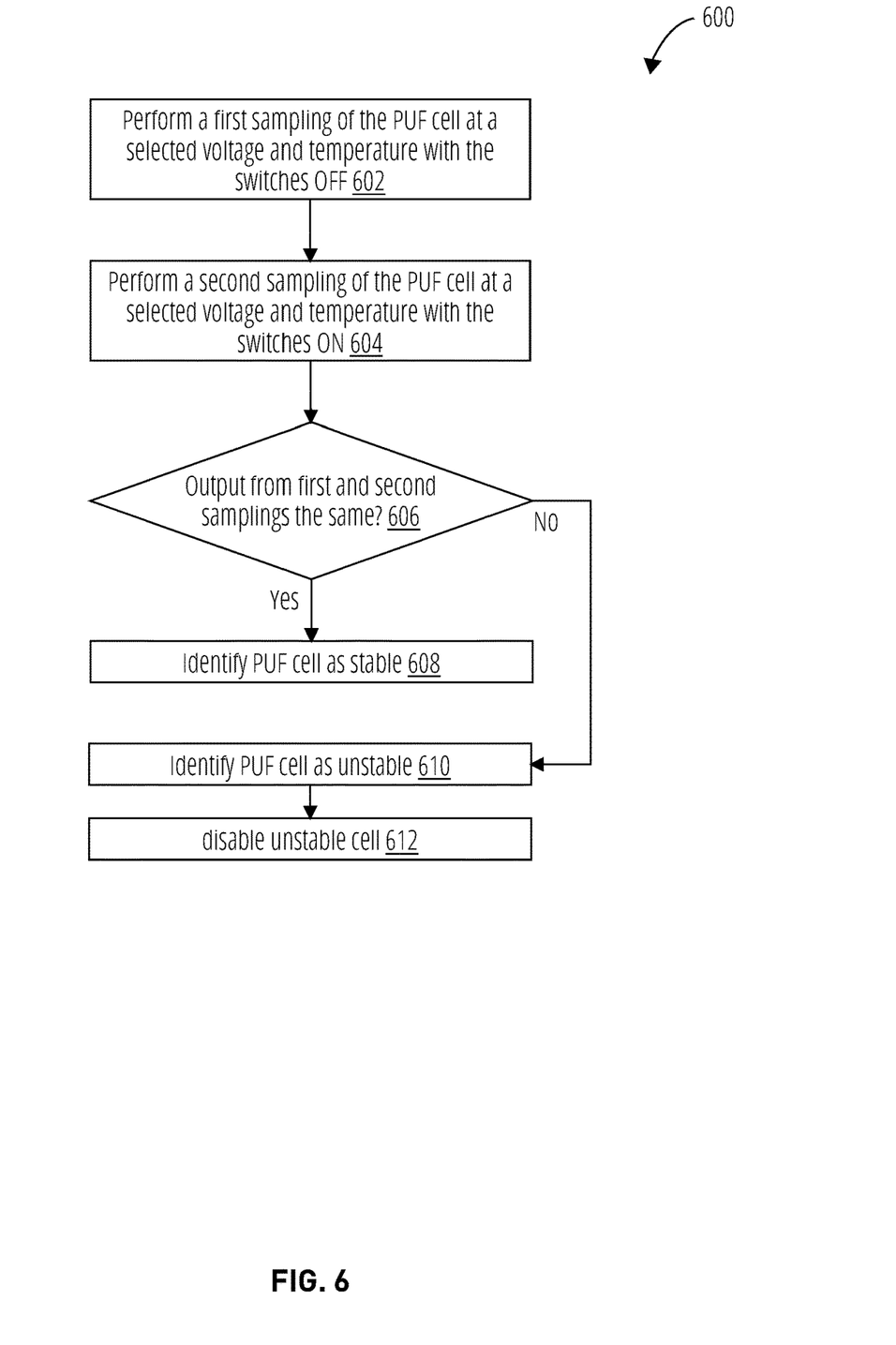
FIG. 6 depicts a cell culling mechanism 600 in accordance with one embodiment.

FIG. 6 depicts a cell culling mechanism 600 in accordance with one embodiment. The cell culling mechanism 600 includes performing at block 602 a first sampling of the PUF cell at a selected voltage and temperature with the switches (see FIG. 4) OFF. The logic 402 described in conjunction with FIG. 4 may configure the switches in ON and OFF states and perform the cell culling mechanism 600.

A second sampling of the PUF cell at a selected voltage and temperature is performed at block 604 with the switches ON. At decision block 606, the outputs (storage node states) generated at block 602 and block 604 may be assessed. If the outputs from both samplings are the same, the PUF cell is identified as stable cell for purposes of contributing to a bit pattern, e.g., a master key (block 608). If the outputs from the two samplings are not the same, the PUF cell is identified as unstable/unusable at block 610, and is disabled or disqualified from contributing to a bit pattern (block 612).

Figure 7:
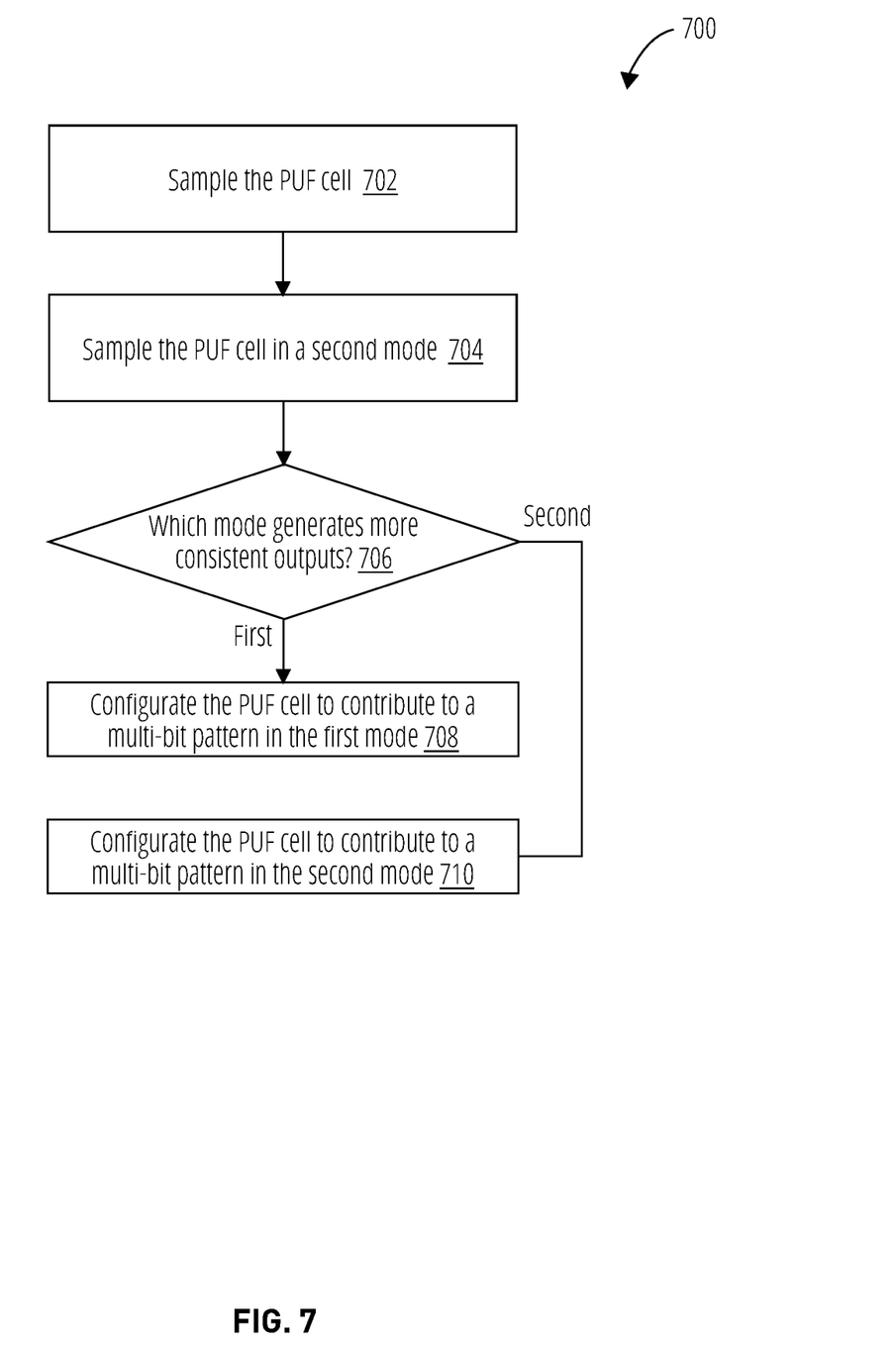
FIG. 7 depicts a cell culling mechanism 700 in accordance with one embodiment.

FIG. 7 depicts an example cell culling mechanism 700 in accordance with one embodiment. The cell culling mechanism 700 includes sampling the PUF cell in a first mode with the switches OFF at block 702. At block 704, the cell culling mechanism 700 includes sampling the PUF cell in a second mode with the switches ON at block 704. The first mode and the second mode may be any one of the modes described previously, such as modes with differing voltage levels applied to different devices in the PUF cell, or modes with the same or different voltage levels applied at differing times to devices of the PUF cell, or modes utilized switched bypass or not. The logic 402 discussed in conjunction with FIG. 4 may carry out the cell culling mechanism 700.

At decision block 706, the outputs (storage node states) generated at block 702 and block 704 may be assessed, and it may be determined which mode generates more consistent outputs. If (on condition that) the outputs from block 702 are more consistent, the PUF cell may be configured to contribute to a multi-bit pattern in the first mode at block 708. If the outputs from block 704 are more consistent, the PUF cell may be configured to contribute to a multi-bit pattern in the second mode at block 710.

LISTING OF DRAWING ELEMENTS

- 102 digital device
- 104 PUF cells
- 106 key value
- 108 encoders and decoders
- 200*a* conventional PUF cell
- 200*b* signal characteristics
- 202 inverter
- 300*a* dual-interlocked PUF cell
- 300*b* signal characteristics
- 302 reset device
- 304 dual-interlocked arrangement
- 306 inverters
- 400 switches
- 402 logic
- 500 dual-interlocked PUF cell
- 502 variable voltage source
- 504 inverter
- 506 reset device
- 600 cell culling mechanism
- 602 block
- 604 block
- 606 decision block
- 608 block
- 610 block
- 612 block
- 700 cell culling mechanism
- 702 block
- 704 block
- 706 decision block
- 708 block
- 710 block Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A circuit comprising:
at least one power supply; and
a Physically Unclonable Function (PUF) cell comprising a dual-interlocked inverter arrangement configured with switches operable to bypass a dual-interlock of the inverter arrangement.

2. The circuit of claim 1, further comprising:
the PUF cell comprising at least four inverters each in a dual-interlock configuration;
a header device configured to power the inverters; and
reset devices arranged to initialize the circuit to a known state.

3. The circuit of claim 1, further comprising:
logic to operate the switches to vary an output stability of the PUF cell.

4. The circuit of claim 3, further comprising logic to:
perform a first sampling of the PUF cell at a particular voltage and temperature with the switches OFF;
perform a second sampling of the PUF cell at the particular voltage and temperature with the switches ON;
on condition that an output of the PUF cell is different between the first sampling and the second sampling, disabling or removing the PUF cell from contributing to an encryption key.

5. The circuit of claim 3, further comprising logic to:
sample the PUF cell in a first mode;
sample the PUF cell in a second mode; and
configurate the PUF cell to contribute to a multi-bit pattern in the one of the first mode or second mode that generates more consistent outputs from the PUF cell.

6. The circuit of claim 1, configured such that closing the switches causes the PUF cell to become operationally equivalent to a static random access memory (SRAM)-type PUF cell.

7. The circuit of claim 1, further comprising:
the at least one power supply configured to generate at least two different voltage levels; and
logic to utilize the at least two voltage levels to vary a stability of the PUF cell.

8. The circuit of claim 7, further comprising:
a plurality of header devices coupled to the different voltage levels; and
the different voltage levels configured to favor generating one output state of the PUF cell over another.

9. The circuit of claim 1, further comprising:
logic to adjust a relative arrival time of a plurality of signals to power or initialize the PUF cell.

10. A digital device comprising:
a plurality of PUF cells each comprising a dual-interlocked inverter arrangement, the PUF cells configured to generate a key value comprising a plurality of bits;
each PUF cell configured with switches operable to bypass a dual-interlock of the inverter arrangement; and
one or both of an encoder and a decoder configured to utilize the plurality of bits.

11. The digital device of claim 10, further comprising:
reset devices arranged to initialize the PUF cells to a known state.

12. The digital device of claim 10, further comprising:
a plurality of switches; and
logic to operate the switches to vary an output stability of the PUF cells.

13. The digital device of claim 12, further comprising:
the switches configured such that closing the switches bypasses a dual-interlock of the PUF cells.

14. The circuit of claim 10, further comprising:
the at least one power supply configured to generate at least two different voltage levels; and
logic to utilize the at least two voltage levels to selectively increase output stability of individual ones of the PUF cells.

15. The circuit of claim 14, further comprising:
a plurality of header devices coupled to supply different inverters of the dual-interlocked inverter arrangement with the different voltage levels.

16. The circuit of claim 11, further comprising:
logic to adjust a relative arrival time of a plurality of signals to power the PUF cells.

17. A method of operating a digital device comprising:
operating a plurality of PUF cells each comprising a switch-bypassable dual-interlocked inverter arrangement to generate a key value; and
utilizing the key value to perform data encryption in the digital device.

18. The method of claim 17, further comprising:
disabling one or more of the PUF cells from contributing to the key value based on a determined output stability of the one or more of the PUF cells.

19. The method of claim 18, wherein the output stability is determined by bypassing interlocks of the dual-interlocked inverter arrangement.

20. A circuit comprising:
at least one power supply;
a Physically Unclonable Function (PUF) cell comprising a dual-interlocked inverter arrangement and a plurality of switches configured such that closing the switches bypasses a dual-interlock of the inverter arrangement; and
logic to operate the switches to vary an output stability of the PUF cell.

21. The circuit of claim 20, configured such that closing the switches causes the PUF cell to become operationally equivalent to a static random access memory (SRAM)-type PUF cell.

22. A method of operating a digital device comprising:
operating a plurality of PUF cells each comprising a dual-interlocked inverter arrangement to generate a key value;

utilizing the key value to perform data encryption in the digital device; and disabling one or more of the PUF cells from contributing to the key value based on a determined output stability of the one or more of the PUF cells.

23. The method of claim 22, wherein the output stability is determined by bypassing interlocks of the dual-interlocked inverter arrangement.

24. A circuit comprising:

at least one power supply;

a Physically Unclonable Function (PUF) cell comprising a dual-interlocked inverter arrangement;

a plurality of switches;

logic to:
  operate the switches to vary an output stability of the PUF cell between a first mode and a second mode; and
  configure the PUF cell to contribute to a multi-bit pattern in the one of the first mode or second mode that generates more consistent outputs from the PUF cell.

* * * * *